(12) United States Patent
Lacourse et al.

(10) Patent No.: US 8,759,191 B2
(45) Date of Patent: Jun. 24, 2014

(54) TUNABLE SEMICONDUCTOR COMPONENT PROVIDED WITH A CURRENT BARRIER

(71) Applicant: Cadeka Microcircuits, LLC, Loveland, CO (US)

(72) Inventors: Alain Lacourse, Laval (CA); Mathieu Ducharme, Montreal (CA); Hugo St-Jean, La Plaine (CA); Yves Gagnon, Owen Sound (CA); Yvon Savaria, Montreal (CA); Michel Meunier, Pierrefonds (CA)

(73) Assignee: Cadeka Microcircuits, LLC, Loveland, CO (US)

( * ) Notice: Subject to any disclaimer, the term of this patent is extended or adjusted under 35 U.S.C. 154(b) by 0 days.

(21) Appl. No.: 13/705,114

(22) Filed: Dec. 4, 2012

(65) Prior Publication Data

US 2013/0095651 A1 Apr. 18, 2013

Related U.S. Application Data

(63) Continuation of application No. 12/087,767, filed as application No. PCT/CA2007/000065 on Jan. 17, 2007, now abandoned.

(51) Int. Cl.
    *H01L 21/4757* (2006.01)
(52) U.S. Cl.
    USPC ............ 438/385; 257/528; 257/529; 438/382
(58) Field of Classification Search
    USPC ............ 438/210, 238, 382, 385; 257/79, 380, 257/542, 543, 529
    See application file for complete search history.

(56) References Cited

U.S. PATENT DOCUMENTS

| 4,134,096 | A | 1/1979 | Denes |
| 4,445,218 | A | 4/1984 | Coldren |
| 5,047,827 | A | 9/1991 | Clark et al. |
| 5,075,241 | A | 12/1991 | Spratt et al. |
| 6,255,671 | B1 | 7/2001 | Bojarczuk et al. |
| 6,329,272 | B1 | 12/2001 | Gagnon et al. |
| 6,890,802 | B2 | 5/2005 | Lacourse et al. |
| 7,217,986 | B2 | 5/2007 | Lacourse et al. |
| 7,675,123 | B2 | 3/2010 | Leenders et al. |
| 2002/0079538 | A1 | 6/2002 | Su et al. |
| 2007/0117227 | A1 | 5/2007 | Gu |

FOREIGN PATENT DOCUMENTS

| CA | 2533225 | 1/2006 |
| EP | 0112097 B1 | 2/1990 |
| EP | 0472331 A2 | 2/1992 |
| JP | 02-163940 | 6/1990 |
| JP | 07-038135 | 2/1995 |
| WO | WO 2007/082373 | 7/2007 |

OTHER PUBLICATIONS

Canadian Patent Application No. 2,533,225, filed Jan. 19, 2006.
PCT Patent Application No. PCT/CA2007/000065, filed Jan. 17, 2007.
U.S Appl. No. 12/087,767, filed Jul. 11, 2008.
Parker et al. Polysilicon Resistor Trimming by Laser Link Making. IEEE Transactions on Semiconductor Manufacturing, IEEE Inc., May 1990, vol. 3, No. 2, pp. 80-83.

*Primary Examiner* — Fernando L Toledo
*Assistant Examiner* — Peter Bradford
(74) *Attorney, Agent, or Firm* — Craig R. Miles; CR Miles P.C.

(57) ABSTRACT

Semiconductor component or device is provided which includes a current barrier element and for which the impedance may be tuned (i.e. modified, changed, etc.) using a focused heating source.

9 Claims, 7 Drawing Sheets

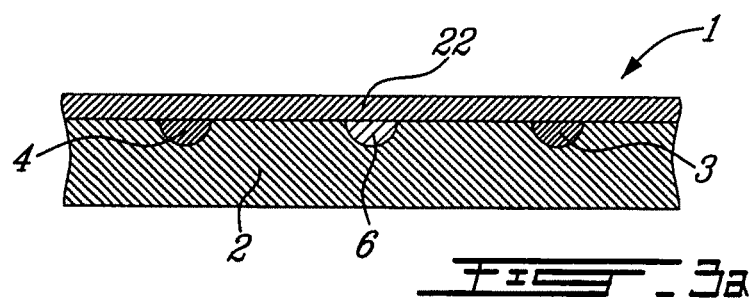
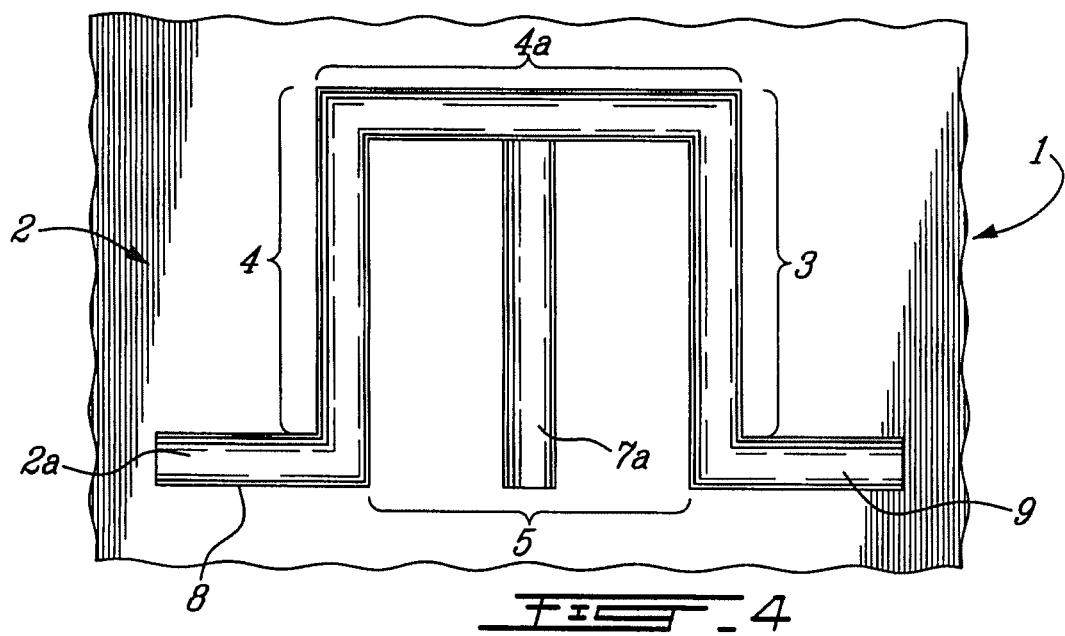

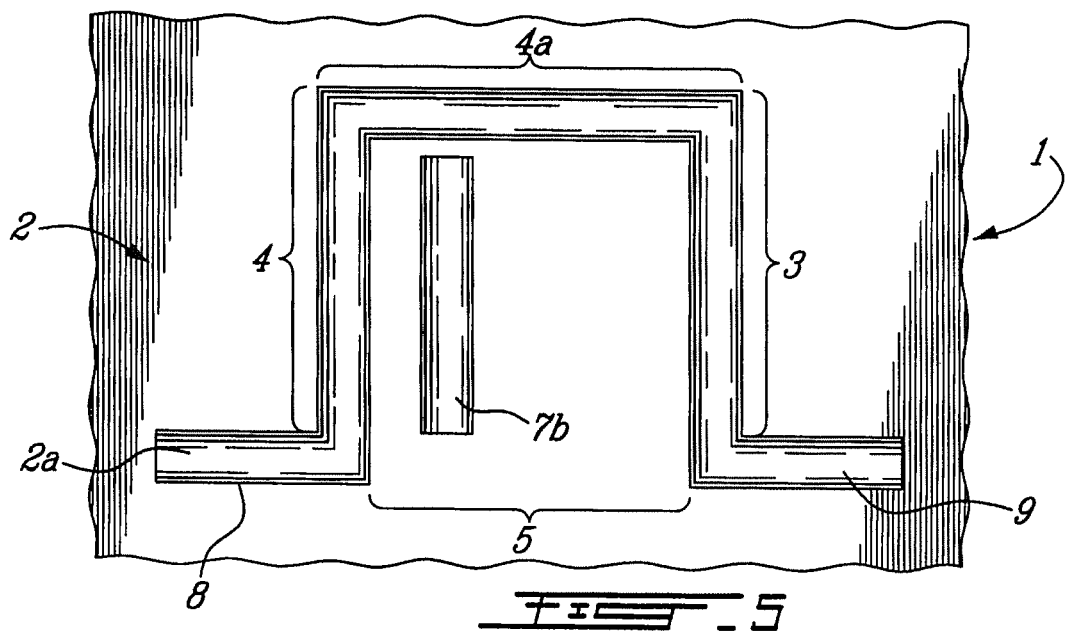
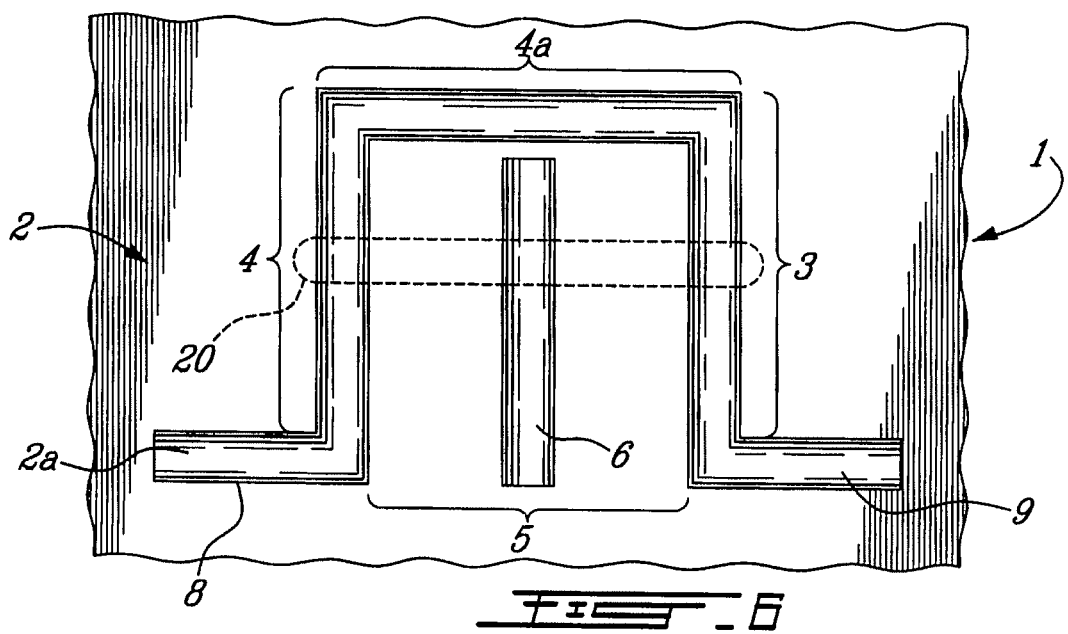

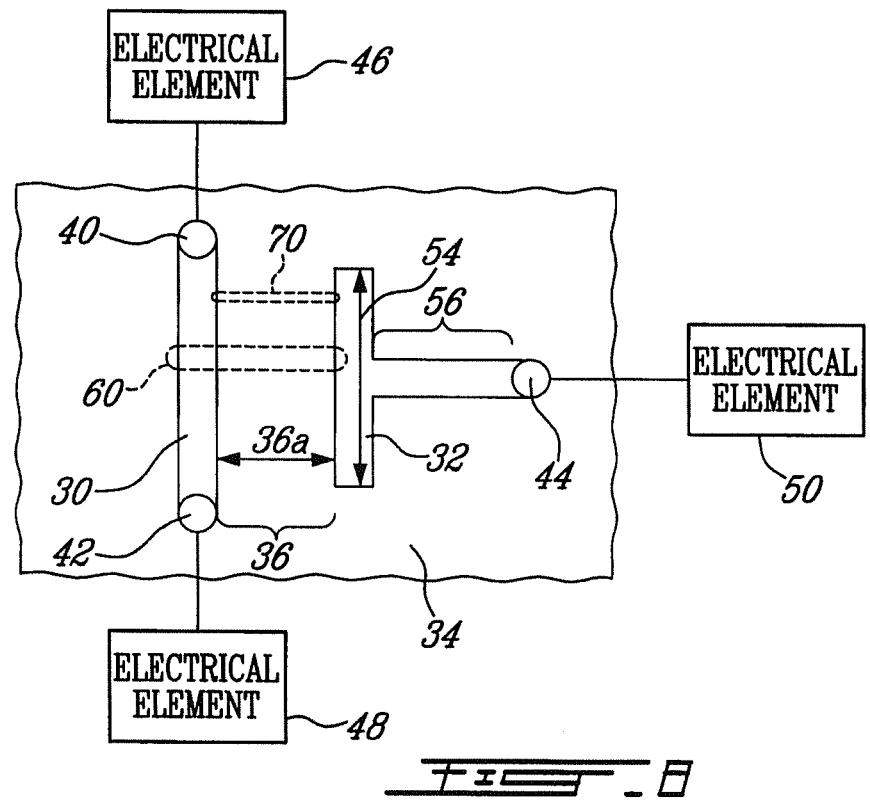
FIG. 8
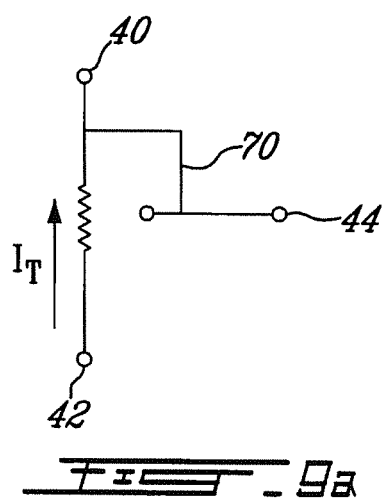 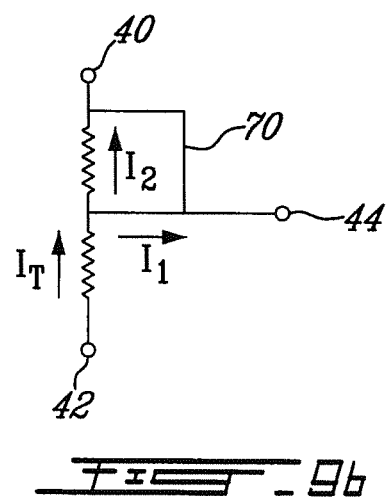
FIG. 9a　　　FIG. 9b

TUNABLE SEMICONDUCTOR COMPONENT PROVIDED WITH A CURRENT BARRIER

This United States Patent Application is a continuation of U.S. patent application Ser. No. 12/087,767, filed Jul. 11, 2008, which is the United States National Stage of International Patent Cooperation Treaty Patent Application No. PCT/CA2007/000065, filed Jan. 17, 2007, which is a continuation of Canadian Patent Application No. 2,533,225, filed Jan. 19, 2006, each hereby incorporated by reference herein.

The present invention relates to the field of semiconductor components or devices, and is directed to semiconductor components or devices the impedance of which may be tuned (i.e. modified, changed, etc.) using a focused heating source.

The present invention is in particular directed to semiconductor components or devices the electrical structure of which may be modified, for example, by the use of a laser, for the creation of conductive links and pathways where none existed before.

The modification of the impedance of a (integrated) semiconductor device or component through the use of lasers is known in the art. Such methods are sometimes referred to as laser trimming of (integrated) semiconductor devices.

It is known for example to (finely) tune the impedance of semiconductor components or devices, by modifying the dopant profile of a region of low dopant concentration (i.e. increasing the dopant concentration) by diffusion of dopants from adjacent regions of higher dopant concentration through the melting action of a focused heating source; the heating source may take any form whatsoever keeping in mind its purpose as described herein; the heating source may for example be able to provide an energy beam such as, for example, a laser beam.

It is in particular known to iteratively selectively tune the impedance of (integrated) semiconductor devices or components, by modifying the dopant profile of a region; see for example U.S. Pat. No. 6,329,272, as well as, U.S. Pat. No. 6,890,802; the entire contents of each of these patents is incorporated herein by reference.

The above mentioned U.S. Pat. No. 6,890,802, describes a semiconductor device or component wherein a base (or main) conductive path (as laid down) of the device or component has an initial (i.e. non-infinite) impedance (e.g. non-infinite resistance) and has a configuration whereby the main conductive path is capable of being trimmed or tuned by decreasing such impedance, e.g. by a laser trimming technique such as described in this patent.

It is known that an integrated semiconductor device may comprise a number of components. Included among these may be areas which may be doped with dopants, such as for example, n type or p type dopants. The dopant concentration of various areas of a device may vary according to their use and application, and there may be, for example, areas of a given dopant concentration, and adjacent thereto there may be areas of higher or lower dopant concentration. It is known that there may therefore be a pair of first areas of a predetermined or selected dopant concentration, and an adjacent intermediate second area of a (relative) lower dopant concentration. As may be understood, the difference in the dopant concentration between areas may be sufficient such that the physical and electrical properties of each of the areas may be different, i.e. for example, under predetermined operating conditions one may conduct electrical current, while the other may not, or their relative capability to conduct electrical current may be different.

Thus U.S. Pat. No. 6,890,802, generally describes an impedance tunable semiconductor component or device which comprises a first conductive region and a second region contiguous with the first region; these regions may be subjected to heating/solidification bridging cycle(s), i.e. for laser trimming. The first conductive region is described as defining a laid down base conductive path and as comprising a first link member and a second link member disposed in juxtaposition such that the first and second link members are separated by a gap region defined by the second region. The first conductive region is a doped region having a heat modifiable dopant profile. The second region is described as being a doped region having a dopant profile rendering said second region non-conductive relative to said first region. The second region is also described as having a heat modifiable dopant profile, at least with respect to the gap region. As described in U.S. Pat. No. 6,890,802 a focused heating source, such as for example a laser, may be used to create or form, a discrete conductive bridge between the first link member and the second link member across the gap region; in other words by the application of a melting/solidification cycle(s), a secondary conductive path may be formed which electrically connects the first link member and the second link member across the gap region.

A first conductive region may be laid down onto a second region by any (known) type of semiconductor making masking technique; i.e. any known process in which unmasked areas of a substrate (e.g. silicon) exposed for example by (known) optical lithographic techniques are bombarded with one or more dopants (i.e. dopants as described herein) to alter the way the silicon conducts electricity in those areas. However, when a first conductive region is laid down onto a second region by (known) lithographic type masking techniques, the masking procedure may, if not rigorously carried out, give rise to an undesirable imperfect result; such imperfection may be due to inadequate thickness of the mask, to the composition of the mask, to the doping duration, etc. Due to the imperfect masking of the portion of the second region intended to be the gap region, the second region defining the gap region may be associated with a hybrid layer (or hybrid region(s)) having an effective dopant composition similar to that of the above mentioned opposed link members. Such a hybrid layer (or hubrid region(s)) may shorten the effective distance between the above mentioned opposed link members or even be contiguous with (i.e. connect) the opposed link members. The hybrid layer (or hybrid region(s)) may for example be relatively thin as compared to the opposed link members. Nevertheless any such hybrid layer (or hybrid region(s)) if present may be such that under (predetermined) operating conditions the hybrid layer (or hybrid region(s)) may allow or facilitate undesired leakage of current across the gap region. Thus, depending on the masking technique used, the mask thickness, the masking material as well as the materials used for the first conductive region and the second region and/or the distance between the first link member and the second link member, (direct) current leakage may occur across the gap region even though the gap region is composed of a material(s) believed to be of a non conductive type, i.e. current may directly cross the gap region in areas not provided with a secondary conductive path. Even, if the masking technique is relatively rigorous such that a hybrid layer (or hybrid region(s)) is for all intents and purposes non-existent (or inconsequential), nevertheless due to the materials used for the first conductive region and the second region, the distance between the first link member and the second link member, the operating parameters (i.e. voltages used), etc., some (direct) current leakage may yet occur across the gap region. The current leakage may be more pronounced as the distance between the first link member and the second link member reaches very small values such as for example 5 microns or less (e.g. 0.1 to 5 microns) i.e. the close proximity of the first link member and the second link member may favour direct current leakage across the across the gap region. In other words, the manipulation and control of the impedance of a device or component thereof by the creation of conductive bridge(s) such as described for example in U.S. Pat. No. 6,890,802, may be complicated by the leakage of current across the gap region between the first link member and the second link member (i.e. uncontrolled or direct current leakage).

It would be advantageous to have means that may offset (i.e. balance, counteract, or compensate for) the possibility of an above mentioned electrical current leakage. It would in particular be advantageous to have a means whereby the gap region may be interrupted by a current barrier region or mask for impeding or arresting the possibility of leakage of current directly across the gap region.

It would be advantageous to have a semiconductor device or component which may be subjected to the above mentioned bridging cycle(s) and which may be provided with (relatively simple) means for providing a resistance (i.e. impedance) barrier or current barrier or mask between the first link member and the second link member in order to offset (i.e. inhibit) the possibility of leakage of current across the gap region (i.e. offset uncontrolled or direct current leakage).

Thus, the present invention generally relates to a current mask region or member configured and disposed to interrupt the above mentioned gap region for offsetting (i.e. inhibiting) the possibility of leakage of current (i.e. inhibiting uncontrolled or direct leakage of current) across the gap region between the first link member and the second link member. The current mask region or member may be spaced apart from the first link member and the second link member any desired, necessary or suitable distance for offsetting the possibility of leakage of current across the gap region and is a doped region having a heat modifiable conductive dopant profile.

The present invention in particular provides an impedance tunable semiconductor component, said semiconductor component comprising a first conductive region defining a laid down base conductive path, said first conductive region comprising a first link member and a second link member, said first region being a doped region having a heat modifiable dopant profile and a second region contiguous with the first region, said second region being a doped region having a dopant profile rendering said second region non-conductive relative to said first region, said first and second link members being disposed in juxtaposition such that said first and second link members are separated by a gap region defined by said second region, said second region having a heat modifiable dopant profile, at least with respect to said gap region characterised in that a current mask region is configured and disposed so as to interrupt said gap region between said first link member and said second link member for offsetting leakage of electrical current across the gap region between the first link member and the second link member, said current mask region being a doped region having a heat modifiable conductive dopant profile.

More particularly the present invention provides an impedance tunable semiconductor component, said semiconductor component comprising a first conductive region, and
a second region
said first conductive region comprising a first type dopant composition said second region comprising a second type dopant composition
said second type dopant composition having a dopant profile configured to render said second type dopant composition non-conductive relative to said first type dopant composition
said first conductive region and said second region being contiguous,
said first conductive region defining a laid down base conductive path,
said first conductive region comprising a first link member and a second link member,
said first and second link members being disposed in juxtaposition such that said first and second link members are separated by a gap region defined by said second region,
said first conductive region having a heat modifiable dopant profile,
said second region having a heat modifiable dopant profile, at least with respect to said gap region,
characterised in that said semiconductor component further comprises a laid down current mask region disposed between and spaced apart from said first link member and said second link member, said current mask region having a heat modifiable dopant profile, and wherein said current mask region comprises a third type dopant composition different from that of said first and second type dopant compositions such that said current mask region interrupts said gap region for offsetting leakage of electrical current across the gap region between the first link member and the second link member.

In accordance with the present invention the first, second and third type dopant compositions as mentioned above or first, second or third regions as mentioned below may each be configured such that each is selected from the group consisting of a p-type dopant composition and an n-type dopant composition, each dopant composition being configured keeping in mind its purpose or function as described herein.

It is understood herein that the amount of dopant to be diffused from an area (or areas) of higher dopant concentration into an area(s) of lower dopant concentration may need to be high enough to counter the presence of the different type of dopant present in the lighter doped areas, such that current may flow through said lightly doped area.

In accordance with the present invention if, for example, a doped first region uses a high concentration of p-type dopant, the lighter doped regions are to be of n-type and vice versa.

Thus for example, a first type dopant composition may be configured to be a p-type composition of high p-type dopant concentration whereas second and third type dopant compositions may both be n-type compositions. The third type dopant composition may be further configured to have a high n-type dopant concentration relative to that of the second type dopant composition but have a lower dopant concentration relative to the dopant concentration of the first dopant composition. In other words the second type dopant composition may comprise a concentration of n-type dopant which is lower than the dopant concentration of the first and third dopant compositions. It is to be understood herein that a dopant composition (or region) may comprise both p and n type dopant but the dopant character of such a dopant composition (or region) is determined by the dopant which is present in a preponderant or majority amount; i.e. a dopant composition which comprises both p and n type dopants may be nevertheless be considered as an n-type dopant composition if the majority of dopant is of the n-type dopant (and vice versa).

In accordance with the present invention a gap region or area may, for example be interrupted by a current mask region, member or area such that the current mask area, member or region may be a distance, from either of the above mentioned link members, of 5.0 microns or less (e.g. from 0.1 to 5.0 microns) and in particular a distance of 0.8 microns or less (e.g. from 0.2 to 0.8 microns). As desired or necessary the gap region or area as a whole may span a distance of 5.0 microns or less (e.g. or less 0.1 to 5.0 microns) between the above mentioned link members.

In accordance with the present invention the current mask region or member may be spaced apart from the first conductive region or alternative be linked (i.e. be contiguous) to a portion thereof other than the link members. In any case the current barrier region or member is still not to have the same dopant profile as the first conductive region, i.e. the third type dopant composition of the current mask region is not to be of the same dopant type as that of the first type dopant composition of the first conductive region. The current mask region or member may as desired or necessary partially or entirely mask the first link member from the second link member.

In accordance with another aspect of the present invention, it has further been appreciated that circumstance may arise wherein it would be advantageous to have a means available in situ in a semiconductor device or component whereby the semiconductor device or component may be configured to custom define by (laser) heat trimming a fractional amount of current that may flow through a predetermined electronic circuit (i.e. a trimable voltage or current divider (potentiometer) component).

Thus the present invention in a further aspect provides an impedance tuneable semiconductor component, said semiconductor component comprising a first conductive region defining a first discrete laid down base path for electrical conduction, said first region being a doped region having a heat modifiable dopant profile, a second conductive region defining a second discrete laid down base path for electrical conduction, said second region being a doped region having a heat modifiable dopant profile
and a third region contiguous with the first and second regions and being a doped region having a dopant profile rendering said third region electrically non-conductive relative to said first and second regions, at least a portion of said second discrete laid down base path being disposed in juxtaposition with said first discrete laid down base path such that said first and second discrete laid down base paths are thereby separated by a gap region defined by said third region, said third region having a heat modifiable dopant profile, at least with respect to said gap region, said first conductive region having a pair of electrical contact means for electrically connecting the first conductive region to two or more electrical elements, said second conductive region having an electrical contact means for electrically connecting the second conductive region to one or more electrical elements.

In accordance with the present invention the first and second conductive regions as well as the third region may have dopant profiles or dopant compositions as described above keeping in mind their purpose.

In accordance with the present invention the second discrete laid down base path may comprise a first element disposed transverse to a second element projecting from the first element, said second element comprising said contact means of said second conductive region, said first element being disposed in juxtaposition with said first discrete laid down base path so as to be separated therefrom by said gap region.

In accordance with the present invention the second discrete laid down base path may comprise a T-like shaped member having a head element and a tail element projecting from the head element, said tail element comprising said contact means of said second conductive region, said head element being disposed in juxtaposition with said first discrete laid down base path so as to be separated therefrom by said gap region.

In accordance with the present invention the second discrete laid down base path may comprise an L-like shaped member having a foot element and a leg element projecting from the foot element, said foot element comprising said contact means of said second conductive region, said foot element being disposed in juxtaposition with said first discrete laid down base path so as to be separated therefrom by said gap region.

In accordance with the present invention an impedance tuneable semiconductor component having discrete first and second laid down base paths as described herein may further include a laid down metallic bridge element and wherein said first and second conductive regions are electrically interconnected by said metallic bridge element, said metallic bridge element being severable by a focused heating source. The presence of such a metallic element will allow for the initial testing of the semiconductor device to see if it is functional; after such initial testing the metallic link element may be cut as by a suitable laser beam etc. The metallic bridge element may be initially laid down in any suitable (known) manner.

In accordance with the present invention, impedance tuneable semiconductor component having discrete first and second laid down base paths as defined herein may further comprises a laid down current mask region (as described herein) interposed in said gap region, said current mask region having a heat modifiable dopant profile, and wherein said current mask region comprises a dopant profile different from that of said first and second conductive regions such that said current mask region interrupts said gap region for offsetting leakage of electrical current across the gap region between said first and second conductive regions. In accordance with the present invention the current mask region may have a dopant profile or dopant composition as described above keeping in mind its purpose as described herein.

It is to be understood herein that the expression "heat modifiable dopant profile" characterizes a region or area (as the case may be) as being one which may, on the application of a suitable heat source, be melted such that dopant may migrate or diffuse there through so as to alter the dopant profile thereof which may be maintained on solidification of the melted area.

It is to be understood herein that the word "impedance" relates to both resistance and capacitance, and that modifying the impedance of an integrated semiconductor device is understood to comprise modifying the resistance and/or the capacitance of a semiconductor device or component, as the case may be.

In accordance with the present invention it is to be understood herein that the expression "laid down" when used in relation to a path, region, element or the like, characterises the path, region, element or the like, as having been initially created by a process other than laser trimming (e.g. by (known) lithographic type masking techniques). Accordingly, the reference to a "laid down current mask region" is to be understood as referring to a region which has been previously created (e.g. by (known) lithographic type masking techniques) prior to any type of tuning or trimming as discussed herein. The reference to a "laid down metallic bridge element" is to be understood as referring to a metallic bridging member created by an suitable metal deposition technique used in the manufacture of semiconductor components or devices prior to any type of tuning or trimming as discussed herein. Similarly, it is to be understood herein that the expression "laid down base conductive path" (i.e. initial conductive path) in relation to a device or component is a reference to a conductive path or region having been created with an initial (i.e. non-infinite) impedance (e.g. non-infinite resistance) prior to any type of tuning or trimming as discussed herein.

Thus, for example, in accordance with the present invention, in relation to the expression "laid down base conductive path" a semi-conductor component or device, before any trimming or tuning as described herein, may already be capable of acting as an electrical conductor having an initial (non-infinite) impedance which may already be near the sought after value, i.e. the initial value is higher than the desired end value. In other words, it is further to be understood herein that a tunable semiconductor component or, device and the like in accordance with the present invention is a semiconductor component, device etc already having a gross impedance obtained as a result of the initial manufacturing process of laying down appropriate layers, substrates etc. This means that the semiconductor construct, device or component has a measurable impedance which may be tested even before being subjected to any type of trimming or tuning as described herein i.e. the semiconductor device or component may have, as mentioned above, a "base conductive path" even before the application of any laser tuning process, i.e. it has a base conductive path which is a "laid down base conductive path".

In accordance with the present invention it is further to be understood herein that the reference to a "focused heating source" or the like, is a reference to any type of heating source of any kind whatsoever (e.g. a laser) whereby one is able to direct, concentrate or apply energy to a predetermined target area (i.e. a target area as described herein) so as to heat the target area for the purpose of altering the dopant profile thereof.

Turning now to the tuning of a device of the present invention, a conductive bridge may be obtained by the application of a bridging cycle comprising one or more laser or heat pulses applied over a (complete) bridge area which may comprise a respective portion of the first link member, of the gap region, of the current mask member or region disposed in the gap region and of the second link member. Thus a bridging cycle may comprise applying a heating/cooling treatment to such a bridge area (i.e. complete bridge area), the heating/cooling treatment comprising directing a focused heating source to melt the bridging area either as a whole or in increments thereof so as to thereby alter the dopant profile of the melted bridging area and allowing said melted bridging area to solidify with an altered dopant profile so as to form thereby said discrete conductive bridge. If desired or needed, a bridging cycle may comprise applying, after an initial heating/cooling treatment, one or more additional heating/cooling treatments to the same heat treated bridging area or portion thereof so as to form thereby said discrete conductive bridge, i.e. a bridging cycle may comprise applying two or more of the heating/cooling treatments to the same bridging area.

More details with respect to the bridging cycles may for example be found in above mentioned U.S. Pat. No. 6,329,272 or U.S. Pat. No. 6,890,802. As mentioned above, in these patents a conductive bridge or link may be obtained by application of a single heat (e.g. laser) pulse; alternatively a conductive link may by obtained by the application of a series of pulses such as for example as described in above mentioned U.S. Pat. No. 6,329,272.

In accordance with the present invention a conductive bridge may, if so desired or appropriate be formed by a controlled diffusion, i.e. it may be formed by a careful, calculated and measured application of focused energy being applied to the integrated semiconductor device, which may result in a controlled and/or determinable quantity of dopants being diffused from one area to an adjacent area having a lower dopant concentration.

Alternatively, in accordance with the present invention, a conductive bridge may, for example, advantageously, be formed from the application of an indiscriminate pulse from a high powered laser (i.e. a blast of energy); the pulse spanning across the gap region over a part of each of the link portions and being applied so as to a provide (under pre-given conditions) a degree of diffusion which may vary from the minimum amount of diffusion (necessary to provide a conductive bridge) to a maximum amount of diffusion which likewise results in a desired conductive bridge.

In accordance with the present invention, semiconductor components or devices may be tuned, which expression (tuned or tuning) is understood to mean that the impedance of the integrated semiconductor device may be modified, adjusted, changed, (i.e. decreased). It is further understood that fine tuning of an integrated semiconductor device is understood to mean that the impedance, once it has been grossly obtained (i.e. by the initial manufacturing process of laying down appropriate layers, substrates etc.), may be finely tuned (i.e. finely adjusted, or with high precision). Fine tuning may involve a single step or a distinct series of steps.

In accordance with the present invention, the tuning of an integrated semiconductor device may be accomplished iteratively, i.e. through the use of an iteration technique or method such as describe for example in above mentioned U.S. Pat. No. 6,329,272 or U.S. Pat. No. 6,890,802. Thus, iteratively or iteration technique is to be understood to mean a process, action or procedure in which repetition of a sequence of operations yields results which are successively closer to a desired result. Therefore, the objectives of a particular embodiment of the present invention may be accomplished through the use of an iteration technique, by which the successive application of heat (i.e. one or more pulses) from a focused heating source to different areas, may progressively yield an impedance profile which is progressively closer to the required or desired profile across a given integrated semiconductor device.

In accordance with a general aspect of the present invention, an (integrated) semiconductor device may comprise a number of components. Included among these components may be areas which may be doped with dopants, such as for example, n-type or p-type dopants. The dopant concentration of various areas of a device may vary according to their use and application. There may be, for example, areas of a given dopant concentration, and adjacent thereto there may be areas of lower dopant concentration. In accordance with an embodiment, there may therefore be a pair of opposed first areas of a predetermined or selected dopant concentration (e.g. high p-type dopant concentration), and an adjacent intermediate second or gap region or area of a (relative) lower dopant concentration (e.g. low n-type dopant concentration). The gap region or area may be interrupted by a mask region or area of the same dopant type as the intermediate gap area. The mask region or area may have a (e.g. n-type) dopant concentration which is higher than that of the gap region or area but which is lower than that of the first opposed region or areas (e.g. any p-type dopant present in the mask region or area due to imperfect lithographic masking being in a more diluted state relative to the n-type dopant such that the mask region or area may be considered to have a n-type dopant composition). As may be understood, the purposes thereof, the difference in the dopant concentration between areas may be sufficient such that the physical and electrical properties of each of the areas may be different, i.e. for example, one may conduct electrical current, while the other may not, or their relative capability to conduct electrical current may be different.

By way of example, in accordance with the present invention, in order to modify the relative dopant concentration difference between first doped areas and a current mask interrupted intermediate second doped area, the following iterative steps may be effected: namely, a focused heating source may be targeted at a selected region or area, which selected region or area may comprise therein at least a portion of a first doped region or area, at least a portion of the intermediate second doped region or area, and at least a portion of a current masked region or area i.e. the selected region or area may straddle the boundary between a first and second doped region or area as well as a current mask doped region or area. As may be understood, the selected area may be generally round, and may or may not evenly straddle the boundaries between the first and the second doped regions.

More particularly, in accordance with of the present invention, an integrated semiconductor device may be provided in any suitable (known) manner wherein the composition of the various regions has been configured such that the device comprises, two conductively interconnected areas or regions of relatively high (e.g. p-type) dopant concentration which are spaced apart by a gap area or region of a relatively lower (e.g. n-type) dopant concentration, the gap area or region being interrupted by a current mask region or area of relatively high (e.g. n-type) dopant concentration. The current mask region may for example, be considered to be of an n-type composition notwithstanding the presence therein of p-type dopant provided that the concentration of p-type dopant is lower than that of n-type dopant. Thus the gap region or area of lower dopant concentration may act as an insulator, between the two first areas of higher dopant concentration and the current mask region as an additional current barrier interrupting the gap area for offsetting current leakage across the gap area. The dopant type and/or concentration thereof of the gap area and current mask area may be of a type and/or concentration such that no or at least essentially no electrical current may flow directly across the gap and mask regions without the presence of a bridge area or element produced by a heat cycle as described herein.

It is understood that for some electrical current to pass through a bridge area of lower dopant concentration disposed between two areas of higher dopant concentration, it is necessary to arrange that the type of dopant in the higher dopant areas be identical, i.e. either all of n type, or all of p type. In accordance with this aspect of the present invention a laser trimming method may be used to modify the dopant concentration of a part of the gap region thereof, therefore decreasing the pre-existing impedance of any part of an integrated semiconductor device. In other words the use of the method of the present embodiment may allow for the impedance of an integrated semiconductor device to be modified such that some electrical current (i.e. as opposed to no electrical current) may be able to flow across a conductive bridge spanning a gap region.

The type of dopant (or dopants) used in a lightly (i.e lower) doped region may, however, not be the same as the type of dopant use in the heavily (i.e. higher) doped regions. For example, if the heavily doped region uses a p type dopant, the lightly doped region is to be of n type, and vice versa. It is understood that in this case, the amount of dopant to be diffused from the area (or areas) of higher dopant concentration into the area of lower dopant concentration may need to be high enough to counter the presence of the different type of dopant present in the lightly doped area, such that current may flow through said lightly doped area.

The level of concentration of the dopants in the areas of high and low concentration may vary significantly. For example, the dopant concentration may vary between $10^{12}$ to $10^{20}$ atoms per $cm^3$ The range of dopant concentration for a lightly doped area may, for example, be between $10^{12}$ to $10^{16}$ atoms per $cm^3$ while the dopant concentration for an area of high dopant concentration may, for example, be between $10^{16}$ to $10^{20}$ atoms per $cm^3$. In any event, the dopant concentration(s) may be those (normally) encountered in industry, i.e. they may be higher or lower than mentioned herein above.

It is understood that the terms lightly doped region and heavily doped region are not meant to exclude a first doped region which dopant concentration is only slightly higher than a second doped region (depending on dopant type). The appropriate or suitable dopant components which may be used in accordance with the present invention may be selected as required from the group comprising boron, phosphorus, aluminium, antimony, arsenic, gallium, indium, lithium, thallium and bismuth. The dopants may be doped in a substrate comprising a material selected from the group comprising silicon, gallium arsenide, silicon-germanium, as well as any suitable compounds selected from columns III-V and II-VI of the periodic table, and compounds having a IV-IV alloy.

Although the present invention is discussed herein by way of example in relation to laser based heat sources, the "focused heating source" which may be used in accordance with the present invention may, as mentioned above, be any (e.g. known) source suitable for the purposes herein; it may for example be a suitable configured device using an electron beam (e.g. the heat source may be selected from a group comprising a laser and an electron beam). Further, the energy of the heating pulses of said focused heating source may be low enough to avoid damaging the integrated semiconductor device.

Although the current mask aspect of the present invention will be described below in particular with respect to a device comprising having a U-like shaped laid down base conductive path the conductive path may have any other shape such as described for example in U.S. Pat. No. 6,890,802.

Example embodiments of the present invention are illustrated in the drawings wherein;

FIG. 3a illustrates schematically the cross-section shown in FIG. 3 but wherein the device has one or more additional laser transparent overlayers;

Figure 2:
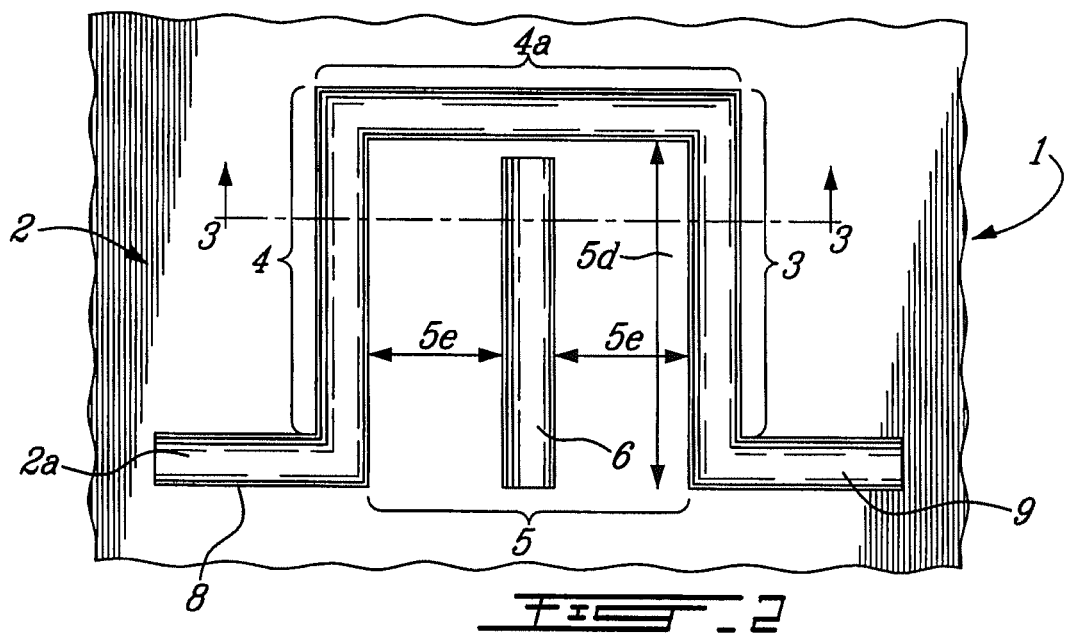
FIG. 2 illustrates schematically an example of a tunable semiconductor component or device in accordance with the present invention, wherein the first conductive region defines a laid down base conductive path which is disposed in the form of a conductive crimp element having a U-like shape configuration or pattern associated with an example current mask region or member of the present invention.
Figure 7:
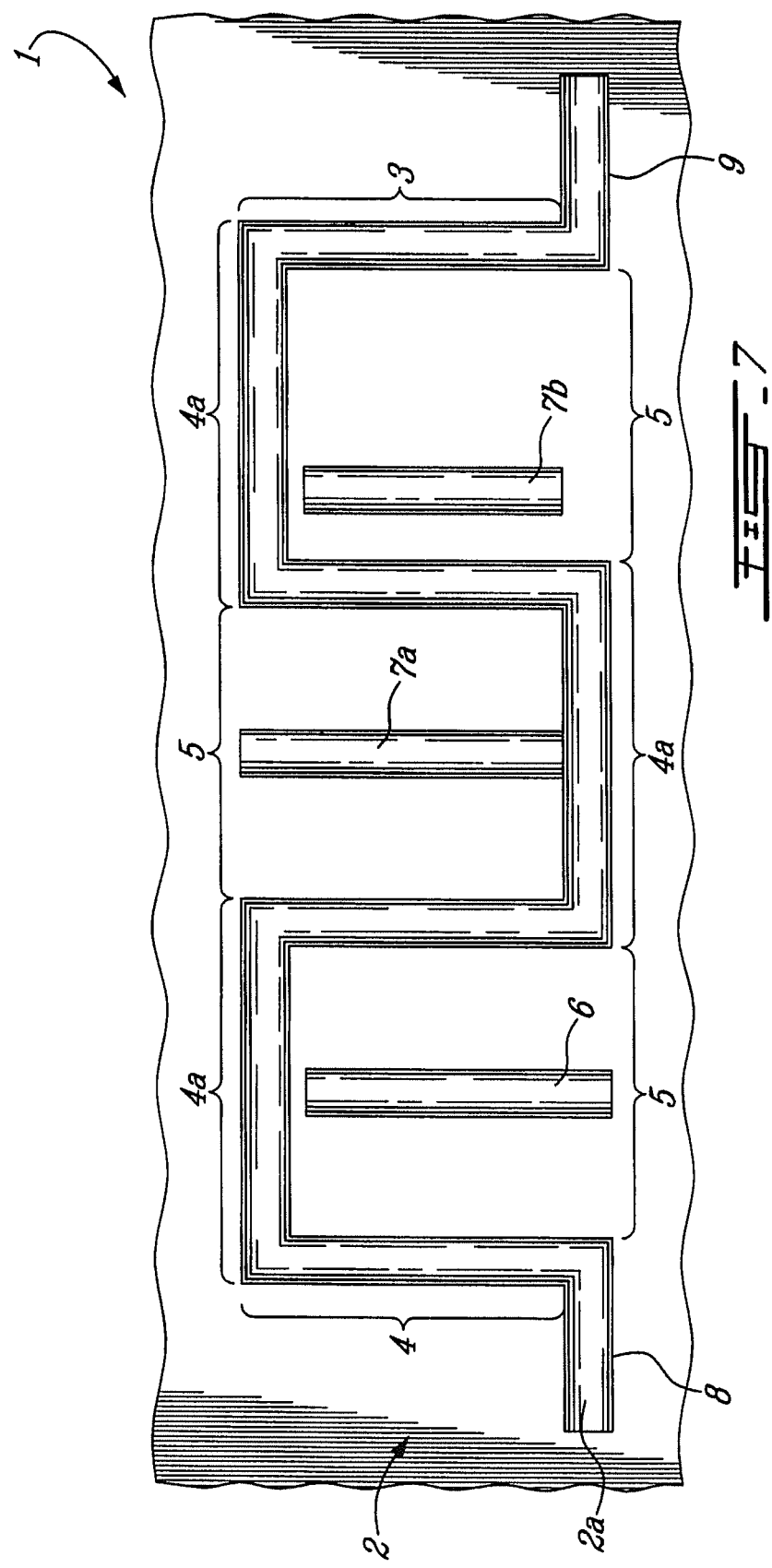
Figure 10:
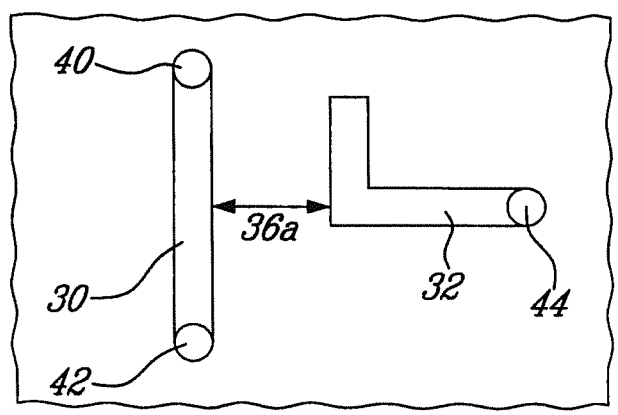
Figure 11:
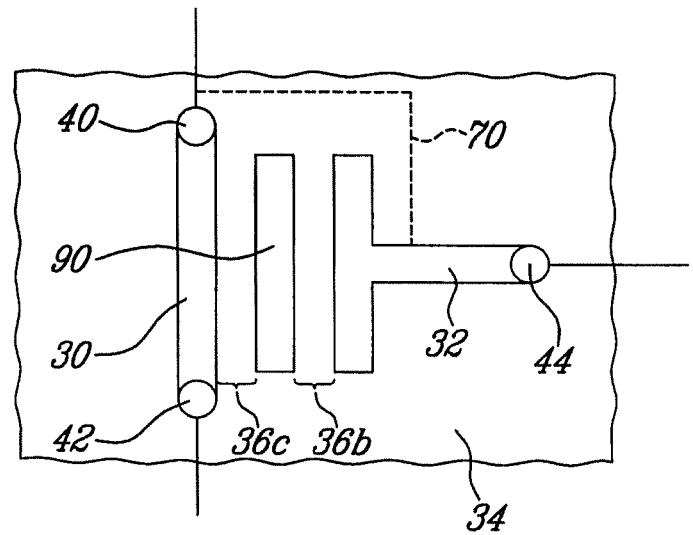

FIG. 4 illustrates schematically another example of a tunable semiconductor component or device in accordance with the present invention, wherein the first conductive region defines a laid down base conductive path which is disposed in the form of a conductive crimp element having a U-like shape configuration or pattern associated with an example current mask member of the present invention connected to or contiguous with the conductive path;

FIG. 5 illustrates schematically a further example of a tunable semiconductor component or device in accordance with the present invention, wherein the first conductive region defines a laid down base conductive path which is disposed in the form of a conductive crimp element having a U-like shape configuration or pattern associated with an example current mask member of the present invention disposed towards the second link member;

FIG. 6 illustrates schematically the tunable semiconductor component or device shown in FIG. 2 wherein the gap region 5 is spanned by a conductive bridge;

FIG. 7 illustrates schematically another a tunable semiconductor component or device in accordance with the present invention, wherein the first conductive region defines a laid down base conductive path in the form of a plurality of conductive crimp elements each having a U-like shape or pattern, each crimp element being associated with a respective current mask region or member;

FIG. 8 illustrates schematically an example embodiment of a tunable semiconductor component or device in accordance with the present invention, wherein the semiconductor device or component may be configured to custom define by heat trimming a fractional amount of current that may flow through a predetermined electronic circuit;

FIG. 9a illustrates an electric schematic of the untuned semiconductor component or device of FIG. 8 further comprising a metallic bridge element;

FIG. 9b illustrates an electric schematic of the semiconductor component or device of FIG. 8 tuned in accordance with the present invention and wherein the metallic bridge element has been severed;

FIG. 10 illustrates schematically another example embodiment of a tunable semiconductor component or device analogous to that shown in FIG. 8; and FIG. 11 illustrates schematically another embodiment of a tunable semiconductor component or device analogous to that shown in FIG. 8 which includes a current mask member.

Figure 1:
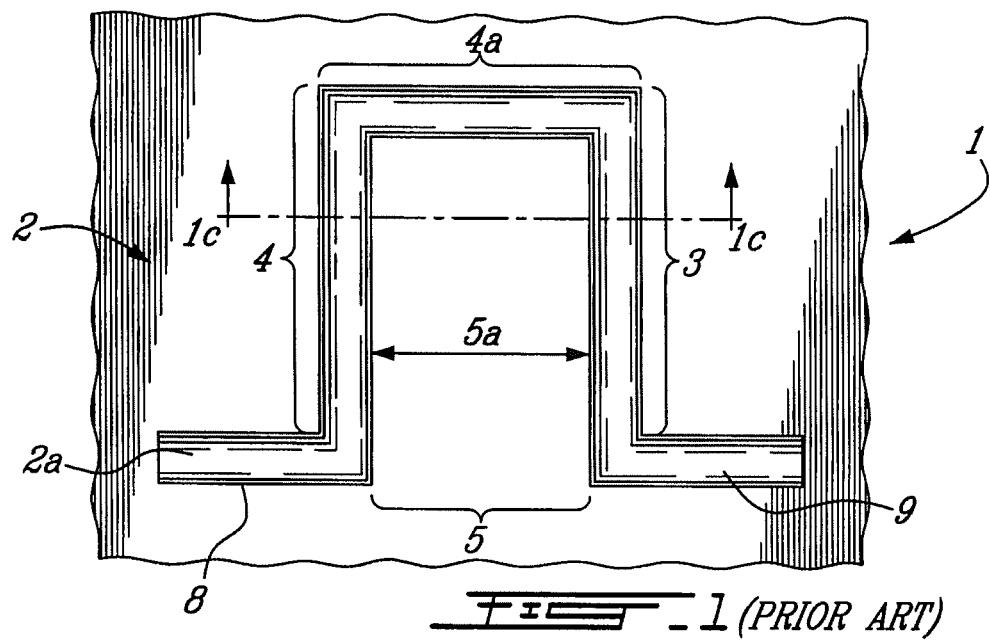
FIG. 1 illustrates schematically an example of a prior art tunable semiconductor component or device, wherein the first conductive region defines a laid down base conductive path which is disposed in the form of a conductive crimp element having a U-like shape configuration or pattern.

FIG. 1 illustrates a prior art tunable semiconductor component or device as shown in FIG. 1 of U.S. Pat. No. 6,890, 802. FIGS. 2 to 7 on the other hand illustrate example embodiments of a tunable semiconductor component or device in accordance with the present invention provided with respective current mask regions or members. The same reference numerals will be used for each of the FIGS. 1 to 7 to denote common or analogous elements.

For each of FIGS. 1 to 7 the tunable semiconductor component or device is generally designated by the reference numeral 1. The device 1 in each case may comprise various layers or regions, for example, a general non-conductive substrate or region 2, and a conductive layer or region 2a which is contiguous with the underlying general substrate or region 2.

The region 2a as illustrated in FIGS. 1 to 6 is shown as having a single crimp element, the crimp element having a first link member or portion 3 and juxtaposed therewith a second link member or portion 4. On the other hand, the embodiment shown in FIG. 7 is shown as having a plurality of crimp elements (i.e. three crimp elements) and as having a plurality of first and second link members 3 and 4; as may be appreciated the link members 3 and 4 of the central crimp element are defined by a link member of an adjacent crimp element and so on.

Referring in particular to FIGS. 1, 2, 4, 5, 6 and 7 the devices illustrated also have a spacing link member or portion 4a which links the first and second link members or portions together. The first and second link members 3 and 4 are spaced apart by gap region 5 which is defined by the general region 2. The gap region 5 may, as shall be discussed in more detail with respect to FIG. 6, be subsequently spanned by one or more heat produced conductive bridges due to (laser) trimming. The devices also have contact or connector members 8 and 9 for electrically connecting the region 2a to other devices, i.e. electrical current is at least initially able to pass through the entire region 2a between these contact members.

The general substrate or region 2 as mentioned above comprises the gap region 5 which is disposed intermediate the first and second link members 3 and 4 of the region 2a.

Turning to FIG. 1, the gap region 5 for this prior art device is shown uninterrupted by any other members and as having a spacing as seen from the arrow 5a (e.g. from 0.1 to 5.0 microns) between the first and second link members 3 and 4.

Figure 1A:
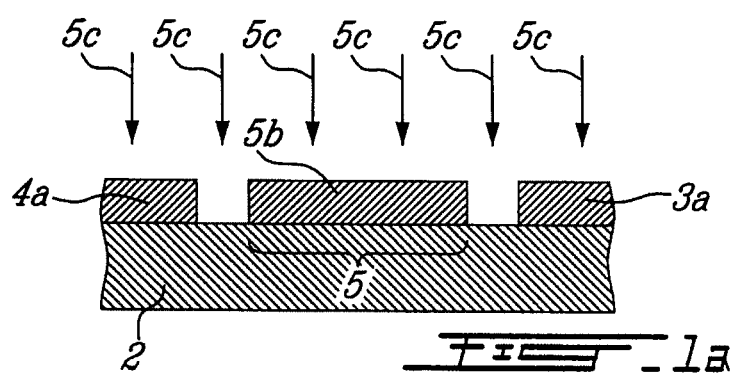
FIG. 1a illustrates schematically a (dopant) masked cross-section of the undoped substrate used to make the semiconductor component or device shown in FIG. 1 by any (known) doping technique (e.g. ion implantation)
Figure 1B:
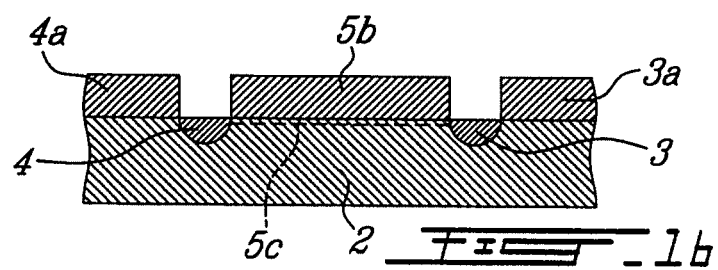
FIG. 1b illustrates schematically a (dopant) masked cross-section of the doped substrate used to make the semiconductor component or device shown in FIG. 1.
Figure 1C:
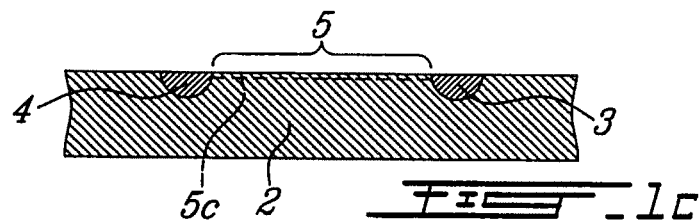
FIG. 1c illustrates schematically a cross-section along 1c-1c of the device shown in FIG. 1 (i.e. wherein the (dopant) mask has been removed)

FIGS. 1a, 1b and 1c show in progressive illustrative schematic fashion the laying down of the region 2a (i.e. by doping of unmasked portions of substrate 2) and in particular the laying down of the first and second link members 3 and 4 of the region 2a. The substrate 2 may for example be pre-configured to comprise an n-type dopant composition of light n-type dopant concentration. The formation of the region 2a may be accomplished by the application of a mask member to the substrate 2 by any known (optical) lithographic technique so as to leave the desired areas (i.e. pattern) of the substrate 2 uncovered by the mask member. The uncovered area(s) of the substrate 2 may then be doped as desired by any (known) doping technique (i.e. by diffusion, ion implantation, etc.) to obtain the first conductive region 2a.

Thus as seen in FIG. 1a the substrate or region 2 is covered by a mask member; for discussion purposes the mask member (as seen in cross-section in FIGS. 1a and 1b) may be considered as having three parts designated generally by the reference designations 3a, 4a and 5b. As may be appreciated the mask part 5b covers the region of the substrate 2 which is intended to define the gap region 5. The masked parts 3a and 4a as seen are spaced apart from the part 5b so as to leave unmasked areas of the substrate 2 which will doped to provide the first and second link members 3 and 4 of the region 2a (see FIGS. 1b and 1c).

As shown schematically in FIG. 1a the arrows 5c illustrate the application of the desired dopant (e.g. a p-type dopant) to the exposed parts of the substrate so as to obtain first and second link members 3 and 4 (e.g. of high p-type dopant concentration).

Although the part 5b covers the gap region 5, the masking may be imperfect such that an undesired (thin) hybrid layer or region 5c may be formed having a p-type dopant character. As shown the hybrid layer or region 5c spans the distance between the first and second link members 3 and 4. However the hybrid layer or region 5c may not span such distance but comprise one or more hybrid region(s) which is/are contiguous with only one of the link members or even be non-contiguous with both of the link members; the hybrid region(s) may also comprise a plurality of non contiguous hybrid regions. In any event, depending on the materials of the mask member, the thickness of the mask member, the doping technique, the spacing 5a between the first and second link members 3 and 4, the applied voltage of use, etc., an electrical current may be able to jump or short circuit across the gap region 5 between the first and second link members 3 and 4 (e.g. as illustrated by arrow 5a) due to the presence of the undesired hybrid layer or region 5c.

Turning to FIGS. 2 to 7, each of the gap regions 5, of the devices in accordance with the present invention, is interrupted by a respective current mask member or region 6, 7a or 7b which are also contiguous with the underlying general substrate or region 2.

Figure 3:
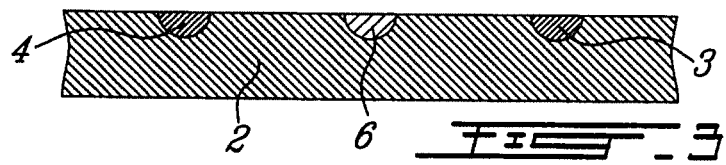
FIG. 3 illustrates schematically a cross-section along 3-3 of the device shown in FIG. 2 (i.e. wherein the (dopant) mask for making the current mask region has been removed)

The current mask member or region 6 (see FIGS. 2 and 7), as shown, is not connected to the spacing link member or portion 4a and is more or less centrally disposed in the gap region 5 so as to be spaced apart from the first and second link members 3 and 4 of the region 2a (see also FIG. 3). The current mask member or region 6 is also of a length which is shorter than that of the first and second link members 3 and 4.

The current mask member or region 7a (see FIGS. 4 and 7), as shown, is connected to or contiguous with the spacing link member or portion 4a. The current mask member or region 7a is shown as being more or less centrally disposed in the gap region 5 whereas the current mask member 7b (FIG. 5) is shown as being disposed towards the second link member 4. In any case, the current mask members or regions 7a and 7b are spaced apart from the first and second link members 3 and 4 of the region 2a. The current mask member or region 7a is also of a length which is more or less equal to that of the first and second link members 3 and 4. The current mask member or region 7b is of a length which is shorter than that of the first and second link members 3 and 4.

The spacing between a current mask member or region and the first and second link members 3 and 4 of the region 2a may take on any suitable or desired value keeping in mind the function of the current mask member or region, namely to offset possible leakage of electrical current across the gap region 5 between the first link member 3 and the second link member 4. Referring to FIG. 2 the current mask area or region 6 may be a distance (arrows 5d and 5e), from either of the above mentioned link members, of 5.0 microns or less (e.g. from 0.1 to 3.0 microns) and in particular a distance of 0.8 microns or less (e.g. from 0.2 to 0.8 microns). The current mask area or region 6 may take on any desired or necessary shape and/or thickness keeping in mind its function.

The gap region 5 may have a width dimension which, in light of the initial fabrication process, may for example, vary from the minimum desired or necessary size (e.g. from 0.2 to 0.8 microns), up to about 10 microns or more, keeping the above in mind; the gap width may for example vary in accordance with the type of heat pulse treatment to be used; e.g. if a single pulse is to be used then as small a width as possible may be in order; if a series of heat pulses is to be used then a large width may be contemplated. In accordance with the present invention the gap width will also vary in accordance with the configuration and disposition of a current mask member disposed therein.

It is to be understood herein of course that the current mask members or regions 6, 7a and 7b are given for illustrative purposes only. A current mask member may take on any other configuration or disposition keeping in mind its function, namely to offset leakage of electrical current across the gap region between the first link member 3 and the second link member 4.

Turning back to FIGS. 2a, 2b and 3, these figures show in progressive illustrative schematic fashion the laying down of the current mask region 6 (i.e. by doping of unmasked portions of substrate 2) on a substrate previously provided with the first and second link members 3 and 4 of the region 2a; for illustrative purposes the hybrid layer or region 5c is not shown in FIGS. 2a, 2b and 3. The formation of the current mask region 6 may also be accomplished by the application of a mask member to the substrate 2 by any known (optical) lithographic technique so as to leave the desired areas (i.e. pattern) of the substrate 2 uncovered by the mask member. The uncovered area(s) of the substrate 2 may then be doped as desired by any (known) doping technique (i.e. by diffusion, ion implantation, etc.) to obtain the current mask region 6.

Figure 2A:
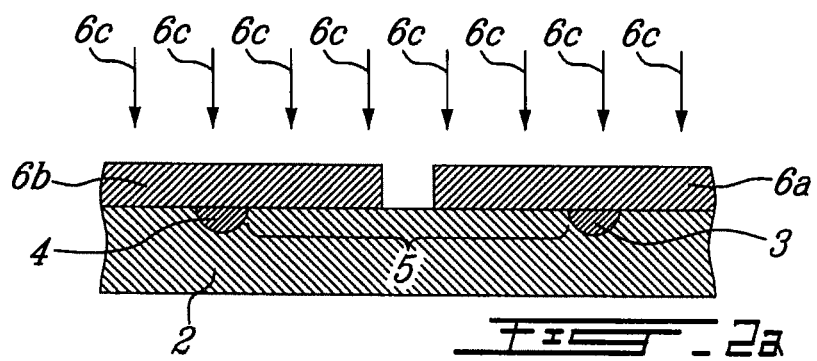
FIG. 2a illustrates schematically illustrates schematically a (dopant) masked cross-section of the doped substrate as shown in FIG. 1c used to make the semiconductor component or device shown in FIG. 2 by any (known) doping technique (e.g. ion implantation)

Thus as seen in FIG. 2a the substrate or region 2 is covered by a mask member; for discussion purposes the mask member (as seen in cross-section in FIGS. 2a and 2b) may be considered as having two parts designated generally by the reference designations 6a and 6b. As may be appreciated the masked parts 6a and 6b as seen are spaced apart so as to leave an unmasked area of the substrate 2 which may be doped to provide the current mask region 6 which interrupts the gap region 5.

As shown schematically in FIG. 2a the arrows 6c illustrate the application of the desired dopant (e.g. a n-type dopant) to the exposed part of the substrate 2 so as to obtain the current mask region 6 (e.g. a region 6 of high n-type dopant concentration relative to the rest of the substrate 2 which may have a dopant composition of n-type of light or low n-type dopant concentration). Thus, for example, if the link members 3 and 4 have a dopant composition of p-type, sufficient n-type dopant may be applied to the exposed substrate between the mask parts 6a and 6b so as to ensure that the region 6 has a dopant composition which is of n-type character sufficient such that said current mask region 6 interrupts said gap region 5 for offsetting possible leakage of electrical current across the gap region between the first link member and the second link member. In effect the doping to get the region 6 is such as to offset or overcome any p-type character that the substrate may have previously had due to the presence of a p-type hybrid layer 5c.

Figure 2B:
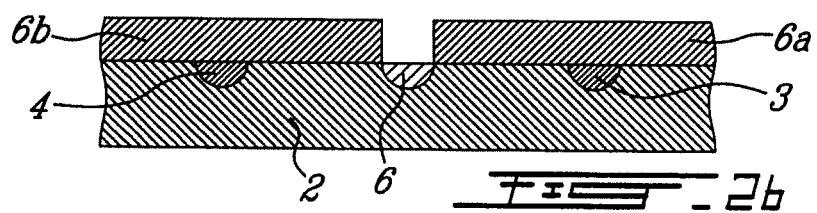
FIG. 2b illustrates schematically a (dopant) masked cross-section of the doped substrate comprising a current mask region used to make the semiconductor component or device shown in FIG. 2.

FIGS. 2a and 2b show the formation of the current mask region 6 onto a substrate previously provided with the first link member and the second link member. Alternatively the current mask region 6 may initially be provided onto a substrate, followed by the laying down of the first link member 3 and the second link member 4. In this latter case, for example, an n-type character of the current mask region 6 may be maintained by the application of a sufficient concentration of n-type dopant to the region 6 such that any leakage of p-type dopant across the mask member covering the gap region 5 will not overcome the n-type character of the current mask region 6.

It is to be understood of course that the dopant character of the various regions may be reversed, i.e. the region 2a may be of n-type dopant character whereas the other regions may be of p-type dopant character.

Although the current mask region has been discussed above in relation to the presence of a hybrid layer or region, it is to be understood that such a current mask region may be laid down even in the absence of such a hybrid layer or region, i.e. as a back-up non-conductive region for offsetting possible current leakage due to factors other than the presence of such hybrid layer or region (e.g. spacing requirements). In any event, the presence of a current mask region may allow for less stringent masking conditions to be used, than may otherwise need to be used, in order to achieve the desired non-conductive effect.

As mentioned the region 2a may be a heavily doped region, i.e. such that region 2a is an electrically conductive region having a heat modifiable dopant profile. As mentioned above, the expression "heat modifiable dopant profile" characterizes a region or area (as the case may be) as being one which may, on the application of a suitable heat source, be melted such that dopant may migrate or diffuse there through so as to alter the dopant profile thereof and which altered dopant profile may be maintained on solidification of the melted area.

On the other hand the gap region 5 as well as current mask member or region may for their part also have a heat modifiable electrically conductive dopant profile which is different from that of the region 2a, keeping in mind their function, namely to offset or inhibit possible leakage of electrical current across the gap region between the first link member 3 and the second link member 4. Thus, for example, the current mask member 6 shown in FIG. 2 may have a heat modifiable electrically conductive dopant profile different from that of the region 2a as well as the gap region 5. Similarly, the current mask members or regions 7a and 7b contiguous with the region 2a as shown in FIGS. 4 and 5 may have a heat modifiable electrically conductive dopant profile which is the different from that of the region 2a.

In any event the region 2 including the gap region 5 and the current mask region 6 have a dopant profile such that for the purposes herein region 2 is a relatively electrically non-conductive region in relation to the region 2a and in particular relative to the first and second link portions 3 and 4 thereof. Thus, relative to the region 2a, the region 2 including the gap region 5 and the current mask region 6 may each be a doped region of lower dopant concentration then the region 2a. The region 2 as in the case of the region 2a, at least in the gap region has a heat modifiable dopant profile.

The regions 2 and 2a as well as the current mask member or region may each comprise suitable or appropriate semiconductor materials such as mentioned hereinabove. The substrate may for example be selected from substrate materials such as silicon, germanium, gallium arsenide, silicon-germanium and other suitable semiconductor materials.

As may be understood herein, a heavily doped region 2a may be heavily doped with either n or p type dopants in sufficient concentrations, and of a required or desired profile such that the heavily doped region is electrically conductive. For example, the dopants may be phosphorous, and may be of a concentration of the order of between $10^{16}$ to $10^{20}$ atoms per $cm^3$. The thickness of the heavily doped regions may for example be of 0.25 micrometers, but may be greater or lesser in accordance with the requirements of a given manufacturing process. Further, the configuration and disposition of such a heavily doped region may also be in accordance with the requirements of a given manufacturing process.

If a region is lightly doped or of lower relative dopant concentration, it is doped with a different dopant type than that present in an adjacent heavily doped region. A lightly doped gap region 5 may be disposed to be adjacent to and abutting the heavily doped first and second link members 3 and 4 as well as a relatively higher doped current mask member or region.

The type and concentration level of dopants in lightly and heavily doped regions is in any event to be selected such that, prior to, as well as after the application of the heat trimming method steps, electrical current flow directly between heavily doped members 3 and 4 across the gap region 5 and across the current mask member, is inhibited. In other words, such cross over current flow is to be favoured by being channeled over a discrete conductive bridge connecting the first link member to the second link member, such conductive bridge spanning the gap region as well as the current mask member and having been created by any suitable (know) heat trimming (e.g. laser trimming) technique(s). Suitable trimming technique(s) which may be applied to a device of the present invention for the formation of such a conductive bridge(s) are outlined in detail in the above mentioned U.S. Pat. No. 6,329,272 and U.S. Pat. No. 6,890,802. Referring to FIG. 6, this figure illustrates and example conductive bridge 20 shown in dotted outline spanning the gap region 5 as well as the current mask member 6.

Referring to FIG. 3a, this figure illustrates an example embodiment of a semiconductor component or device of the present invention which may comprise one or more overlaying layers (one of which is shown and is designated with the reference numeral 22) which are transparent to suitable heat source e.g. laser (i.e. light) transparent layer(s). The transparent layer(s) may comprise an oxide layer(s) e.g. a layer of silicon dioxide $SiO_2$. The transparent layer(s) are such as to allow heat trimming of the underlying device structure.

Turning to FIG. 8, this figure illustrates an example embodiment of a tuneable semiconductor component or device in accordance with the present invention, wherein the semiconductor device or component may be configured to custom define by heat trimming a fractional amount of current that may flow through a predetermined electronic circuit. The semiconductor component comprises a first conductive region 30 defining a first laid down base conductive path, and a second conductive region 32 defining a second laid down base conductive path. Both the first region 30 and the second region 32 of this embodiment are doped regions having a heat modifiable dopant profile which may be of the same or different dopant composition. The semiconductor component or device further comprises a third region 34 contiguous with the first and second regions, i.e. regions 30 and 32 are laid down on the underlying region 34 in similar fashion as for the devices as seen from FIGS. 1 and 2. This third region 34 is a doped region having a dopant profile rendering the third region non-conductive relative to the first and second regions (see above). The first and second regions 30 and 32 are disposed in juxtaposition such that the first and second regions are separated by a gap region 36 defined by said third region. The third region has a heat modifiable dopant profile, at least with respect to said gap region. The first region has respective contact means 40 and 42 and the second region has respective contact means 44; the respective contact means are for electrically connecting the first and second regions respectively to one or more other electrical elements (the electrical elements are designated generally by the reference numerals 46, 48 and 50); the other electrical elements may take on any desired necessary form or configuration and are connected to the contact means by suitable electrically conductive lines. The second conductive region 32 as seen in FIG. 8 comprises a T-like shaped member having a head element of length 54 and a tail element 56 projecting from the head element, said tail element 56 comprising said contact means 44, said head element being disposed in juxtaposition with said first region so as to be separated by said gap region 36 having a span distance 36a similar to that of distance 5a of FIG. 1.

The first, second and third regions 30, 32 and 34 may be doped as referred to above with respect to the devices shown in FIGS. 2 to 7 keeping in mind the purpose of a device as shown in FIG. 8 is to allow for the custom definition of a conductive bridge by heat trimming across the gap such that the device may provide a fractional amount of current flow through the predetermined electronic circuit 50. In other words when a conductive bridge 60 such as shown in dotted outline in FIG. 8 is formed for example by laser trimming as referred to above, the electrical result is a resistance or impedance circuit as shown in FIG. 9b. As desired or necessary more than one such conductive bridge 60 may be formed to obtain a desired or necessary current division.

As shown in FIGS. 8 and 9a the first and second regions 30 and 32 may initially be interconnected by a metallic bridge element 70 set in place in any suitable (e.g. lithographic) manner; the bridge element 70 may be used to test the electrical integrity of the device prior to heat trimming. Once the heat trimming is to be done the bridge element 70 may be cut or severed for example by use of a suitable laser.

Referring to FIGS. 9a and 9b once the metallic bridge element 70 is cut and prior to heat trimming the current $I_T$ flows between contact means 40 and 42. After the formation of the desired or necessary conductive bridge(s) the current may be divided as shown in FIG. 9b such that $I_T=I_1+I_2$.

For FIGS. 10 and 11 the same reference numerals will be used to designate common elements.

FIG. 10 illustrates a modified alternate embodiment of tuneable semiconductor component or device shown in FIG. 8 wherein the second region 32a has an L-like shape rather than a T-like shape.

FIG. 11 illustrates a further modified embodiment of tuneable semiconductor component or device shown I FIG. 8 wherein the device is provided with a discrete current mask member or region 90 having the characteristics of a current mask member or region as described above with respect to FIGS. 2 to 7. The mask region is spaced apart from the regions 30 and 32 by the distances designated by the arrows 36c and 36b which may have values as mentioned above in relation to the arrows 5d and 5e of FIG. 2.

The invention claimed is:

1. A method for offsetting leakage of electrical current of a semiconductor component, comprising:

laying down a first conductive region defining a first link member and a second link member, said first conductive region being a first type dopant composition having a heat modifiable dopant profile;

laying down a second region contiguous with said first conductive region, said second region defining a gap region between said first and second link members, said second region being a second type dopant composition having a heat modifiable dopant profile, said second type dopant composition having a lower dopant concentration than said first dopant composition; and laying down a current mask region in said gap region between and spaced apart from said first link member and said second link member, said current mask region being a third type dopant composition having a heat modifiable dopant profile, said third type dopant composition having a dopant concentration greater than said second dopant concentration and lesser than said first dopant concentration, said current mask region interrupts said gap region for offsetting leakage of electrical current across said gap region between said first link member and said second link member.

2. The method of claim 1, further comprising applying a bridging cycle of focused heat to a part of said first conductive region, said second region, and said current mask region to form a discrete conductive bridge across said gap region connecting said first link member and said second link member.

3. The method of claim 2, further comprising laying down a metallic bridge element which electrically interconnects said first link member and said second link member, said metallic bridge element severable by a focused heating source.

4. The method of claim 3, further comprising laying down a spacing link member which links said first link member and said second link member, said current mask region disposed in said gap region spaced apart from or connected to said spacing link member.

5. The method of claim 3, further comprising disposing said current mask region at a central location in said gap region.

6. The method of claim 3, further comprising disposing said current mask region at a location toward said first link member.

7. The method of claim 3, further comprising disposing said current mask region at location toward said second link member.

8. The method of claim 2, further comprising laying down said first link member or said second link member in the form of a T-like shaped member having a head element and a tail element projecting from the head element, said tail element a contact means of said first conductive region.

9. The method of claim 2, further comprising laying down said first link member or said second link member in the form of an L-like shaped member having a foot element and a leg element projecting from the foot element, said foot element comprising a contact means of said first conductive region.

* * * * *